(12) United States Patent
Daibou et al.

(10) Patent No.: US 9,087,980 B2
(45) Date of Patent: Jul. 21, 2015

(54) MAGNETORESISTIVE ELEMENT AND MAGNETIC MEMORY

(71) Applicants: KABUSHIKI KAISHA TOSHIBA, Minato-ku (JP); WPI-AIMR, Tohoku University, Sendai-Shi (JP)

(72) Inventors: Tadaomi Daibou, Yokohama (JP); Junichi Ito, Yokohama (JP); Tadashi Kai, Tokyo (JP); Minoru Amano, Sagamihara (JP); Hiroaki Yoda, Sagamihara (JP); Terunobu Miyazaki, Sendai (JP); Shigemi Mizukami, Sendai (JP); Koji Ando, Tsukuba (JP); Kay Yakushiji, Tsukuba (JP); Shinji Yuasa, Tsukuba (JP); Hitoshi Kubota, Tsukuba (JP); Akio Fukushima, Tsukuba (JP); Taro Nagahama, Tsukuba (JP); Takahide Kubota, Sendai (JP)

(73) Assignees: KABUSHIKI KAISHA TOSHIBA, Minato-ku (JP); WPI-AIMR, Tohoku University, Sendai-shi (JP)

( * ) Notice: Subject to any disclaimer, the term of this patent is extended or adjusted under 35 U.S.C. 154(b) by 0 days.

(21) Appl. No.: 14/183,122

(22) Filed: Feb. 18, 2014

(65) Prior Publication Data
US 2014/0159177 A1    Jun. 12, 2014

Related U.S. Application Data

(62) Division of application No. 13/310,154, filed on Dec. 2, 2011, now Pat. No. 8,680,632.

(30) Foreign Application Priority Data

Mar. 25, 2011   (JP) ................................ 2011-068868

(51) Int. Cl.
*H01L 29/82*      (2006.01)
*H01L 43/10*      (2006.01)
(Continued)

(52) U.S. Cl.
CPC .............. *H01L 43/10* (2013.01); *H01L 27/226* (2013.01); *H01L 43/08* (2013.01)

(58) Field of Classification Search
CPC .......... H01L 43/02; H01L 43/08; H01L 43/10; H01L 27/222; H01L 27/224; H01L 27/226
USPC ........... 257/421, 425, 414; 365/158, 171, 173
See application file for complete search history.

(56) References Cited

U.S. PATENT DOCUMENTS

2011/0303997 A1    12/2011    Wang et al.
2012/0088125 A1    4/2012    Nishiyama et al.

FOREIGN PATENT DOCUMENTS

JP    2008-010590    1/2008
JP    2008-252037    10/2008
(Continued)

OTHER PUBLICATIONS

Kubota et al., "Composition dependence of magnetoresistance effect and its annealing endurance in tunnel junctions having Mn—Ga electrode with high perpendicular magnetic anisotropy", 2011, Appl. Phys. Letters, vol. 99, pp. 192509-1-192509-3, (published on Nov. 11, 2011).*

(Continued)

*Primary Examiner* — Nikolay Yushin
(74) *Attorney, Agent, or Firm* — Oblon, McClelland, Maier & Neustadt, L.L.P.

(57) ABSTRACT

A magnetoresistive element according to an embodiment includes: a base layer; a first magnetic layer formed on the base layer, and including a first magnetic film having an axis of easy magnetization in a direction perpendicular to a film plane, the first magnetic film including $Mn_xGa_{100-x}$ (45≤x<64 atomic %); a first nonmagnetic layer formed on the first magnetic layer; and a second magnetic layer formed on the first nonmagnetic layer, and including a second magnetic film having an axis of easy magnetization in a direction perpendicular to a film plane, the second magnetic film including $Mn_yGa_{100-y}$ (45≤y<64 atomic %). The first and second magnetic layers include different Mn composition rates from each other, a magnetization direction of the first magnetic layer is changeable by a current flowing between the first magnetic layer and the second magnetic layer via the first nonmagnetic layer.

19 Claims, 7 Drawing Sheets

(51) Int. Cl.
H01L 43/08 (2006.01)
H01L 27/22 (2006.01)

(56) References Cited

FOREIGN PATENT DOCUMENTS

| | | |
|---|---|---|
| JP | 2009-239052 | 10/2009 |
| JP | 2010-232499 | 10/2010 |
| WO | WO 2010/110029 A1 | 9/2010 |
| WO | WO 2010/119928 | 10/2010 |

OTHER PUBLICATIONS

Inomata et al., "Structural and magnetic properties and tunnel magnetoresistance for Co2(Cr, Fe)Al and Co2FeSi full-Heusler alloys", 2006, J. Phys. D: Appl. Phys., vol. 39, pp. 816-823 (published on Feb. 17, 2006).*

Benjamin Balke, et al., "$Mn_3Ga$, a compensated ferrimagnet with high Curie temperature and low magnetic moment for spin torque transfer applications", Applied Physics Letters 90, 152504, 2007, 3 pages.

Feng Wu, et al., "Electrical transport properties of perpendicular magnetized Mn—Ga epitaxial films", Applied Physics Letters 96, 042505, 2010, 3 pages.

W. H. Butler, et al., "Spin-dependent tunneling conductance of Fe | MgO | Fe sandwiches", Physical Review B, vol. 63, 054416, 2001, 12 pages.

Proceedings of $55^{th}$ Annual Conference on Magnetism and Magnetic Materials Nov. 14-18, 2010, p. 166.

Proceedings of $11^{th}$ Joint MMM-Intermag Conference 2010, p. 1199.

Thaddeus B. Massalski, "Binary Alloy Phase Diagrams", vol. 2, pp. 1144-1145.

M. Tanaka, et al., "Epitaxial Ferromagnetic MnGa and (MnNi) Ga Thin Films with Perpendicular Magnetization on GaAs", 1993 MRS Spring Meeting, 1 page.

T. Matsui, et al., "Metastable Ferromagnetic Phase Formation in 35-50 at. % Mn—Ga Thin Films", Journal of Applied Physics 73, vol. 73 6683 (1993), pp. 6683-6685.

W. Feng, et al., "Epitaxial Growth and Magnetic Properties of Mn—Ga Thin Films on GaSb (001)", Journal of the Korean Physical Society, vol. 56, No. 4, Apr. 2010, pp. 1382-1386.

K. Wang, et al., "Epitaxial Growth of Ferromagnetic σ-Phase Manganese Gallium on Semiconducting Scandium Nitride (0 0 1)", Journal of Crystal Growth 311 (2009), pp. 2265-2268.

K. Wang, et al., "Delta-Phase Manganese Gallium on Gallium Nitride: A Magnetically Tunable Spintronic System", Materials Research Society Symposium Proceedings vol. 1118, 2009, pp. 69-74.

Benjamin Balke, et al., "$Mn_3$ Ga, a compensated ferrimagnet with high Curie temperature and low magnetic moment for spin torque transfer applications", Applied Physics Letters 90, 152504, 2007, 3 pages, Dec. 2007.

M. Tanaka, et al., "Epitaxial growth of ferromagnetic ultrathin MnGa films with perpendicular magnetization on GaAs", Appl. Phys. Lett. vol. 62, No. 13, Mar. 29, 1993, pp. 1565-1567.

Feng Wu, et al., "Electrical transport properties of perpendicular magnetized Mn-Ga epitaxial films", Applied Physics Letters 96, 042505, 2010, 3 pages Apr. 2010.

W. H. Butler, et al., "Spin-dependent tunneling conductance of Fe |MgO | Fe sandwiches", Physical Review B, vol. 63, 054416, 2001, 12 pages, May 2001.

S. Mizukami, et al., "Long-Lived Ultrafast Spin Precession in Manganese Alloys Films with a Large Perpendicular Magnetic Anisotropy", Physical Review Letters, PRL 106, 117201, Mar. 2011, 4 pages.

Proceedings of $55^{th}$ Annual Conference On Magnetism and Magnetic Materials Nov. 14-18, 2010, p. 166, Dec. 2010.

Proceedings of $11^{th}$ Joint MMM-Intermag Conference 2010, p. 1199, Dec., 2010.

Thaddeus B. Massalski, "Binary Alloy Phase Diagrams", vol. 2, pp. 1144-1145, Dec. 1986.

M. Tanaka, et al., "Epitaxial Ferromagnetic MnGa and (MnNi) Ga Thin Films with Perpendicular Magnetization on GaAs", 1993 MRS Spring Meeting, 1 page, Mar. 1993.

T. Matsui, et al., "Metastable Ferromagnetic Phase Formation in 35-50 at. % Mn—Ga Thin Films", Journal of Applied Physics 73, vol. 73 6683 (1993), pp. 6683-6685, Jun. 1993.

W. Feng, et al., "Epitaxial Growth and Magnetic Properties of Mn-Ga Thin Films on GaSb (001)", Journal of the Korean Physical Society, vol. 56, No. 4, Apr. 2010, pp. 1382-1386.

K. Wang, et al., "Epitaxial Growth of Ferromagnetic 6-Phase Manganese Gallium on Semiconducting Scandium Nitride (0 0 1)", Journal of Crystal Growth 311 (2009), pp. 2265-2268, Dec. 2009.

K. Wang, et al., "Delta-Phase Manganese Gallium on Gallium Nitride: A Magnetically Tunable Spintronic System", Materials Research Society Symposium Proceedings vol. 1118, 2009, pp. 69-74, Dec. 2009.

Office Action issued in Japanese Patent Application No. 2011-068868, filed Mar. 25, 2011 (with English-language Translation).

Office Action issued on Jan. 30, 2015 in Japanese Patent Application No. 2011-068868, filed Mar. 25, 2011 (with English-language Translation).

* cited by examiner

MAGNETORESISTIVE ELEMENT AND MAGNETIC MEMORY

CROSS-REFERENCE TO RELATED APPLICATION

This application is a divisional of U.S. application Ser. No. 13/310,154 filed Dec. 2, 2011, and is based upon and claims the benefit of priority from prior Japanese Patent Application No. 2011-68868 filed on Mar. 25, 2011 in Japan, the entire contents of each of which are incorporated herein by reference.

FIELD

Embodiments described herein relate generally to a magnetoresistive element and magnetic memory.

BACKGROUND

It is known that a MTJ (Magnetic Tunnel Junction) element serving as a magnetoresistive element has a stacked structure as a basic structure, and shows a tunneling magnetoresistive (TMR) effect. The stacked structure is formed by a first ferromagnetic layer, a tunnel barrier layer, and a second ferromagnetic layer. Such MTJ elements are used in 100 bits per square inch (Mbpsi) HDD heads and magnetic random access memories (MRAMs).

A MRAM characteristically stores information ("1", "0") depending on changes in the relative angle of the magnetizations of magnetic layers included in each MTJ element, and therefore, is nonvolatile. Since a magnetization switching takes only several nanoseconds, high-speed data writing and high-speed data reading can be performed. Therefore, MRAMs are expected to be the next-generation high-speed nonvolatile memories. If a technique called a spin torque transfer switching technique for controlling magnetization through spin-polarized current is used, the current density can be made higher when the cell size of the MRAM is made smaller. Accordingly, high-density, low-power-consumption MRAMs that can readily invert the magnetization of a magnetic material can be formed.

Furthermore, in recent years, attention has been drawn to the theory that a magnetoresistance ratio as high as 1000% can be achieved by using MgO as the tunnel barrier layer. Since the MgO is crystallized, selective tunneling conduction of the electrons having a certain wavenumber from the ferromagnetic layer can be performed, and those electrons can keep the wavenumber during that time. At this point, the spin polarization has a large value in a certain crystalline orientation, and therefore, a giant magnetoresistive effect appears. Accordingly, an increase in the magnetoresistive effect of each MTJ element leads directly to a higher-density MRAM that consumes less power.

Meanwhile, to form high-density nonvolatile memories, high integration of magnetoresistive elements is essential. However, the ferromagnetic bodies forming magnetoresistive elements have thermal disturbance resistance that is degraded with a decrease in element size. Therefore, how to improve the magnetic anisotropy and thermal disturbance resistance of each ferromagnetic material is a critical issue.

To counter this problem, trial MRAMs using perpendicular-magnetization MTJ elements in which ferromagnetic bodies have magnetization directions perpendicular to the film plane have been made in recent years. In a perpendicular-magnetization MTJ element, a material having high magnetic crystalline anisotropy is normally used for ferromagnetic bodies. Such a material has a magnetization in a certain crystal direction, and the magnetic crystalline anisotropy of the material can be controlled by changing the composition ratio between constituent elements and the crystallinity of the constituent elements. Accordingly, the magnetization direction can be controlled by changing the direction of crystal growth. Also, since ferromagnetic bodies have high magnetic crystalline anisotropy, the aspect ratio of the element can be adjusted. Furthermore, having high thermal disturbance resistance, ferromagnetic bodies are suited for integration. In view of those facts, to realize a highly-integrated MRAM that consumes less power, it is critical to manufacture perpendicular-magnetization MTJ elements that have a great magnetoresistive effect.

DETAILED DESCRIPTION

Figure 1:
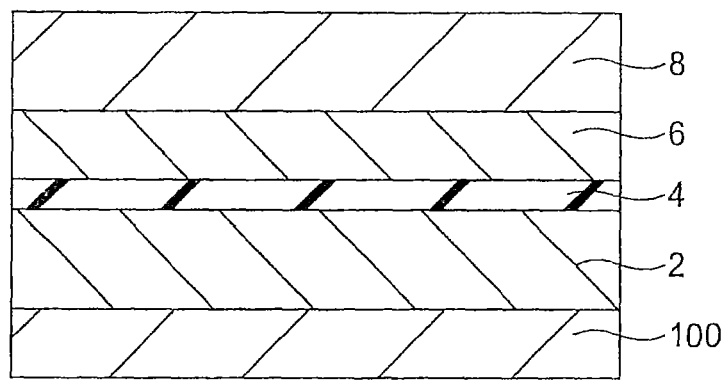
FIG. 1 is a cross-sectional view of a magnetoresistive element according to a first embodiment.

A magnetoresistive element according to an embodiment includes: a base layer; a first magnetic layer formed on the base layer, and including a first magnetic film having an axis of easy magnetization in a direction perpendicular to a film plane, the first magnetic film including $Mn_xGa_{100-x}$ ($45 \leq x < 64$ atomic %); a first nonmagnetic layer formed on the first magnetic layer; and a second magnetic layer formed on the first nonmagnetic layer, and including a second magnetic film having an axis of easy magnetization in a direction perpendicular to a film plane, the second magnetic film including $Mn_yGa_{100-y}$ ($45 \leq y < 64$ atomic %). The first and second magnetic layers include different Mn composition rates from each other, a magnetization direction of the first magnetic layer is changeable by a current flowing between the first magnetic layer and the second magnetic layer via the first nonmagnetic layer.

The following is a description of embodiments, with reference to the accompanying drawings. In the following description, components having the same functions and structures are denoted by the same reference numerals, and explanation of them will be repeated only where necessary.

First Embodiment

Figure 2:
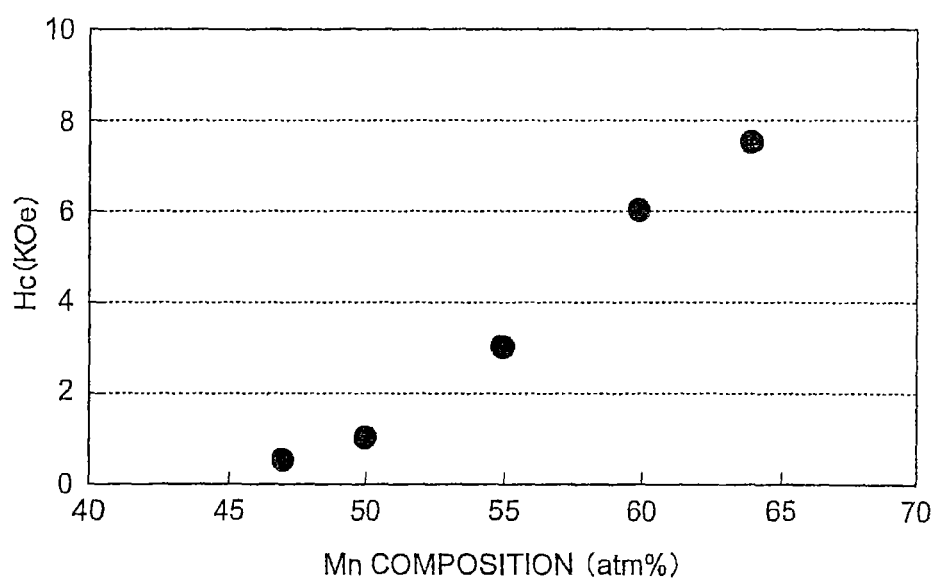
FIG. 2 is a diagram showing a variation in the coercive force in a perpendicular direction with respect to the Mn composition rate in a MnGa layer.

FIG. 1 shows a magnetoresistive element according to a first embodiment. FIG. 1 is a cross-sectional view of the magnetoresistive element 1 of the first embodiment. The magnetoresistive element 1 of this embodiment is a MTJ element, and has a structure that is formed by stacking a ferromagnetic layer 2, a nonmagnetic layer 4 (hereinafter also referred to as the tunnel barrier layer 4), an interfacial magnetic layer 6, and a ferromagnetic layer 8 in this order on a base layer 100. The base layer 100 is used to control the crystalline properties such as the crystalline orientations and grain sizes of the ferromagnetic layer 2 and the layers located above the ferromagnetic layer 2, and the characteristics of the base layer 100 will be described later in detail. The ferromagnetic layer 2 contains Mn and Ga, and the composition ratio between the Mn and Ga is $Mn_xGa_{100-x}$ (45≤x<64 atomic %). FIG. 2 shows the variation in the coercive force in a vertical direction with respect to the Mn composition rate in a structure expressed as "5-nm thick Ta/30-nm thick MnGa/Cr/MgO substrate". It should be noted that the left-hand side of each symbol "/" indicates an upper layer, and the right-hand side of each "/" indicates a lower layer. When the composition ratio is $Mn_{50}Ga_{50}$, the coercive force is approximately 1 kOe. As the Mn composition rate is increased, the coercive force becomes greater, and increases to approximately 6 kOe when the composition ratio is $Mn_{60}Ga_{40}$. The samples used here were formed by performing co-sputtering on a sample of $Mn_{45}Ga_{55}$ and a Mn target, and systematically varying the composition rates. Here, the composition rates of Mn and Ga are designed values. In a case where MnGa is formed by a sputtering technique, MnGa targets are normally used. However, it is very difficult to form MnGa targets that cover all composition ratios. When the Mn composition rate is decreased, the target cracks. The limit composition rate of Mn to Ga at which a target can be formed without a crack in the MnGa is approximately 45 atomic %. Therefore, $Mn_{45}Ga_{55}$ is set as the lower limit of the Mn composition rate. The resistance value of a MTJ element which comprises two magnetic layers and a tunnel barrier interposed between the two magnetic layers is determined by the angle between the magnetization directions of the two magnetic layers. The angle between the magnetization directions can be controlled by adjusting an external magnetic field or the current to be applied to the element. In that case, the difference in coercive force between the two magnetic layers is made larger, so that the angle between the magnetization directions can be more stably controlled. Here, the magnetic layer with the greater coercive force is referred to as the reference layer, and the magnetic layer with the smaller coercive force is referred to as the recording layer. Therefore, a Magnetic layer to be used as the reference layer is normally expected to have a great coercive force, and a magnetic layer to be used as the recording layer is normally expected to have a small coercive force. Since the coercive force can be increased by increasing the Mn concentration as shown in FIG. 2, such a layer is more suited to be the reference layer.

A MnGa phase diagram shown in the reference (Thaddeus B. Massalski, "BINARY ALLOY PHASE DIAGRAMS", Vol. 2, p. 1144) suggests that different phases coexist in the composition domain where the Mn concentration is approximately 65% or higher. In view of that, crystal growth is predicted in a situation where phases with different magnetic properties coexist in the composition domain, and this might result in variations of magnetic properties. Therefore, a MnGa magnetic material was stably formed, and, to achieve desired magnetic properties, the upper limit of the composition rate of Mn to Ga was set at 64 atomic %. Meanwhile, the ferromagnetic layer 8 is a ferromagnetic layer that does not contain Mn and Ga, and the characteristics of the ferromagnetic layer 8 will be described later in detail. In the first embodiment, MgAlO is preferably used as the nonmagnetic layer 4. For example, in a case where a stacked structure is formed by stacking a ferromagnetic layer made of MnGa, a nonmagnetic layer made of crystalline MgO, and a ferromagnetic layer made of MnGa in this order, the epitaxial relationship, MnGa (001)/MgO (001)/MnGa (001), can be formed. Here, MnGa (001) and MgO (001) mean that crystals are oriented so that the (001) surfaces are exposed in the normal directions of the respective films. Accordingly, the wavenumber selectivity of tunneling electrons can be improved, and a high magnetoresistance ratio can be achieved. In a case where MnGa has crystalline orientation so that the (001) surface is exposed in the normal direction of the film, the lattice constant in the film in-plane direction is approximately 3.91 Å, regardless of the composition ratio between Mn and Ga. The lattice mismatch determined from the lattice constants of bulks in the film in-plane directions of MnGa and MgO is as large as approximately 7.7%. The lattice mismatch is defined by the following mathematical formula: (a(MgO)−a(MnGa))/a(MnGa)×100. Here, a(MgO) and a(MnGa) represent the lattice constants of MnGa and MgO in the film in-plane directions, respectively. If the lattice mismatch is large, a dislocation or the like is caused in an interface so as to reduce the interfacial energy generated due to lattice distortion. In that case, an epitaxial relationship is formed between crystal grains, and it is difficult to cause uniform epitaxial growth in the film plane. When a current is applied to the element, a dislocation becomes the scattering source of electrons, and the magnetoresistance ratio becomes lower. Therefore, to cause uniform epitaxial growth in the film plane without a dislocation, it is essential to form a stacked structure with materials having a small lattice mismatch. Therefore, MgAlO is used as the nonmagnetic layer 4, and MnGa (001)/MgAlO (001)/MnGa (001) is formed. For example, the lattice constant of $MgAl_2O_4$ in the a-axis direction is 8.09 Å. Accordingly, the lattice mismatch can be reduced to 3.5%, and a higher magnetoresistance ratio is achieved.

The ferromagnetic layer 2 and the ferromagnetic layer 8 each have an easy magnetization direction perpendicular to the film plane. That is, the MTJ element 1 of this embodiment is a so-called perpendicular-magnetization MTJ element in which the ferromagnetic layer 2 and the ferromagnetic layer 8 each have a magnetization direction perpendicular to the film plane. It should be noted that, in this specification, "film plane" refers to the upper surface of each ferromagnetic layer. Also, "easy magnetization direction" is the direction in which a macro-size ferromagnetic material has the lowest internal energy when the spontaneous magnetization direction of the macro-size ferromagnetic material is the same as the direction in a situation where there are no external magnetic fields. On the other hand, "hard magnetization direction" is the direction in which a macro-size ferromagnetic material has the largest internal energy when the spontaneous magnetization direction of the macro-size ferromagnetic material is the same as the direction in a situation where there are no external magnetic fields.

When a write current is applied to the MTJ element 1, the magnetization direction of one of the ferromagnetic layer 2 and the ferromagnetic layer 8 remains the same i.e. fixed before and after writing, and the magnetization direction of the other one is changeable. The ferromagnetic layer having a fixed magnetization direction is also referred to as the reference layer, and the ferromagnetic layer having a changeable magnetization direction is also referred to as the recording layer. In this embodiment, the ferromagnetic layer 2 is the recording layer, and the ferromagnetic layer 8 is the reference layer, for example. A write current flowing in a direction perpendicular to the film plane is applied between the ferromagnetic layer 2 and the ferromagnetic layer 8. In a case where the ferromagnetic layer 2 is the recording layer, the ferromagnetic layer 8 is the reference layer, and the magnetization direction of the ferromagnetic layer 2 is antiparallel to (or the opposite of) the magnetization direction of the ferromagnetic layer 8, a write current is applied from the ferromagnetic layer 2 toward the ferromagnetic layer 8. In that case, electrons flow from the ferromagnetic layer 8 to the ferromagnetic layer 2 via the interfacial magnetic layer 6 and the nonmagnetic layer 4. The electrons that are spin-polarized through the ferromagnetic layer 8 flow into the ferromagnetic layer 2. The spin-polarized electrons having spins in the same direction as the magnetization direction of the ferromagnetic layer 2 pass through the ferromagnetic layer 2. However, the spin-polarized electrons having spins in the opposite direction from the magnetization direction of the ferromagnetic layer 2 apply a spin torque to the magnetization of the ferromagnetic layer 2, to change the magnetization direction of the ferromagnetic layer 2 to the same direction as the magnetization direction of the ferromagnetic layer 8. Accordingly, the magnetization direction of the ferromagnetic layer 2 is switched, and becomes parallel to (or the same as) the magnetization direction of the ferromagnetic layer 8.

In a case where the magnetization direction of the ferromagnetic layer 2 and the magnetization direction of the ferromagnetic layer 8 are parallel, on the other hand, a write current is applied from the ferromagnetic layer 8 to the ferromagnetic layer 2. In that case, electrons flow from the ferromagnetic layer 2 to the ferromagnetic layer 8 via the nonmagnetic layer 4 and the interfacial magnetic layer 6. As a result, the electrons that are spin-polarized through the ferromagnetic layer 2 flow into the ferromagnetic layer 8. The spin-polarized electrons having spins in the same direction as the magnetization direction of the ferromagnetic layer 8 pass through the ferromagnetic layer 8. However, the spin-polarized electrons having spins in the opposite direction from the magnetization direction of the ferromagnetic layer 8 are reflected by the nonmagnetic layer 4, and flow into the ferromagnetic layer 2 through the interfacial magnetic layer 6 and the nonmagnetic layer 4. As a result of this, a spin torque is applied to the magnetization of the ferromagnetic layer 2, to change the magnetization direction of the ferromagnetic layer 2 to the opposite direction from the magnetization direction of the ferromagnetic layer 8. Accordingly, the magnetization direction of the ferromagnetic layer 2 is switched, and becomes antiparallel to the magnetization direction of the ferromagnetic layer 8. It should be noted that the interfacial magnetic layer 6 is employed to increase spin polarization.

In the first embodiment, the ferromagnetic layer 2, the nonmagnetic layer 4 (hereinafter also referred to as the tunnel barrier layer 4), the interfacial magnetic layer 6, and the ferromagnetic layer 8 are stacked in this order on the base layer 100. However, those layers can be stacked in reverse order on the base layer 100. That is, the ferromagnetic layer 8, the interfacial magnetic layer 6, the nonmagnetic layer 4, and the ferromagnetic layer 2 can be stacked in this order on the base layer 100.

Second Embodiment

Figure 3:
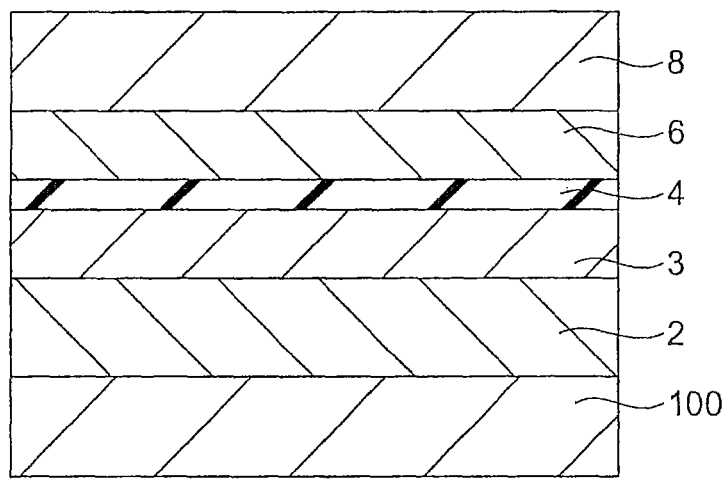
FIG. 3 is a cross-sectional view of a magnetoresistive element according to a second embodiment.

FIG. 3 shows a magnetoresistive element according to a second embodiment. FIG. 3 is a cross-sectional view of the magnetoresistive element 1A of the second embodiment. The magnetoresistive element 1A of this embodiment is a MTJ element, and has a structure that is formed by stacking a ferromagnetic layer 2, an interfacial magnetic layer 3, a nonmagnetic layer 4, an interfacial magnetic layer 6, and a ferromagnetic layer 8 in this order on a base layer 100. The ferromagnetic layer 2 contains Mn and Ga, and the composition ratio between the Mn and Ga is $Mn_xGa_{100-x}$ (45≤x<64 atomic %). MnAl is preferably used as the interfacial magnetic layer 3, so as to increase spin polarization. As the nonmagnetic layer 4, the later described tunnel barrier layer material can be used, but it is preferable to use MgAlO. As the interfacial magnetic layer 3, MnGa can also be used.

As in the first embodiment, each of the ferromagnetic layer 2 and the ferromagnetic layer 8 has magnetic anisotropy in a direction perpendicular to the film plane, and has an easy magnetization direction perpendicular to the film plane. That is, the MTJ element 1A of this embodiment is a so-called perpendicular-magnetization MTJ element in which the ferromagnetic layer 2 and the ferromagnetic layer 8 each have a magnetization direction perpendicular to the film plane. When a write current is applied to the MTJ element 1A, the magnetization direction of one of the ferromagnetic layer 2 and the ferromagnetic layer 8 remains the same before and after writing, and the magnetization direction of the other one is changeable. In this embodiment, the ferromagnetic layer 2 is the reference layer, and the ferromagnetic layer 8 is the recording layer, for example. A write current flowing in a direction perpendicular to the film plane is applied between the ferromagnetic layer 2 and the ferromagnetic layer 8, as in the first embodiment. It should be noted that the interfacial magnetic layers 3 and 6 are employed to increase spin polarization, as in the first embodiment.

In the second embodiment, the ferromagnetic layer 2, the interfacial magnetic layer 3, the nonmagnetic layer 4, the interfacial magnetic layer 6, and the ferromagnetic layer 8 are stacked in this order on the base layer 100. However, those layers can be stacked in reverse order on the base layer 100. That is, the ferromagnetic layer 8, the interfacial magnetic layer 6, the nonmagnetic layer 4, the interfacial magnetic layer 3, and the ferromagnetic layer 2 can be stacked in this order on the base layer 100.

Third Embodiment

Figure 4:
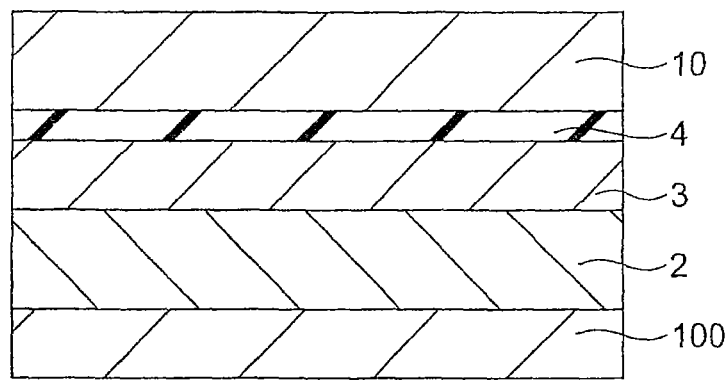
FIG. 4 is a cross-sectional view of a magnetoresistive element according to a third embodiment.

FIG. 4 shows a magnetoresistive element according to a third embodiment. FIG. 4 is a cross-sectional view of the magnetoresistive element 1B of the third embodiment. The magnetoresistive element 1B of this embodiment is a MTJ element, and has a structure that is formed by stacking a ferromagnetic layer 2, an interfacial magnetic layer 3, a nonmagnetic layer 4, and a ferromagnetic layer 10 in this order on a base layer 100. The ferromagnetic layer 2 and the ferromagnetic layer 10 contain Mn and Ga, and the composition ratio between the Mn and Ga is $Mn_xGa_{100-x}$ (45≤x<64 atomic %). In this case, the Mn composition rate in the ferromagnetic layer 10 is made to differ from the Mn composition rate in the ferromagnetic layer 2, so as to cause a difference in the coercive force between the ferromagnetic layer 10 and the ferromagnetic layer 2. The ferromagnetic layer with the lower Mn composition rate serves as the recording layer, and the ferromagnetic layer with the higher Mn composition rate serves as the reference layer. A coercive force difference of 1 kOe or larger is sufficient between the reference layer and the recording layer. If a ferromagnetic layer with $Mn_{50}Ga_{50}$ is the recording layer, a ferromagnetic layer of MnGa having a Mn composition rate of 55 atomic % or higher is suited to be the reference layer according to FIG. 2. Also, MnAl is preferably used as the interfacial magnetic layer 3, so as to increase spin polarization. In the third embodiment, the later described material can be used as the nonmagnetic layer 4. As the interfacial magnetic layer 3, MnGa can also be used.

As in the first and second embodiments, the MTJ element 1B of third embodiment is also a so-called perpendicular-magnetization MTJ element. Also, as in the first and second embodiments, the interfacial magnetic layer 3 is employed to increase spin polarization.

In the third embodiment, the ferromagnetic layer 2, the interfacial magnetic layer 3, the nonmagnetic layer 4, and the ferromagnetic layer 10 are stacked in this order on the base layer 100. However, those layers can be stacked in reverse order on the base layer 100. That is, the ferromagnetic layer 10, the nonmagnetic layer 4, the interfacial magnetic layer 3, and the ferromagnetic layer 2 can be stacked in this order on the base layer 100.

Fourth Embodiment

Figure 5:
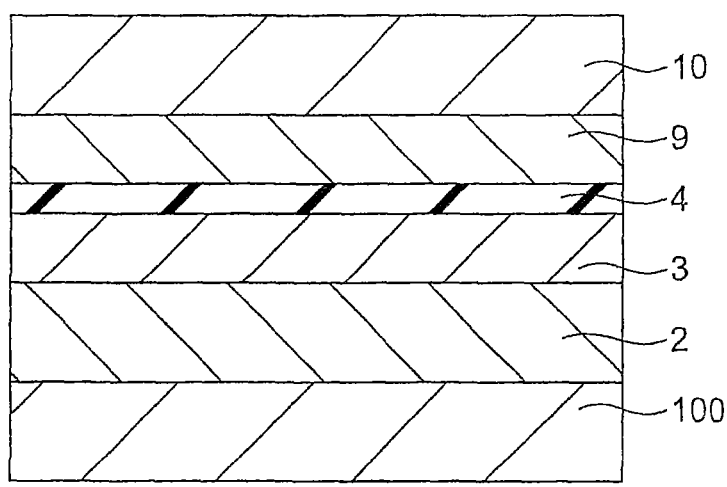
FIG. 5 is a cross-sectional view of a magnetoresistive element according to a fourth embodiment.

FIG. 5 shows a magnetoresistive element according to a fourth embodiment. FIG. 5 is a cross-sectional view of the magnetoresistive element 1C of the fourth embodiment. The magnetoresistive element 1C of this embodiment is a MTJ element, and has a structure that is formed by stacking a ferromagnetic layer 2, an interfacial magnetic layer 3, a nonmagnetic layer 4, an interfacial magnetic layer 9, and a ferromagnetic layer 10 in this order on a base layer 100. The ferromagnetic layer 2 and the ferromagnetic layer 10 contain Mn and Ga, and the composition ratio between the Mn and Ga is $Mn_xGa_{100-x}$ (45≤x<64 atomic %). In the fourth embodiment, a difference in the coercive force is caused between the ferromagnetic layer 10 and the ferromagnetic layer 2, to differ the Mn composition rates from each other, as in the third embodiment. Also, MnAl is preferably used as the interfacial magnetic layers 3 and 9, so as to increase spin polarization. And also, the interfacial magnetic layer 3 and 9, can be an alloy containing at least one element selected from the group consisting of Fe and Co, and at least one element selected from the group consisting of Cr, Ni, B, C, P, Ta, Ti, Mo, Al, Si, W, Nb, Mn, and Ge. For example, the alloy can be CoFeB, but can also be CoFeSi, CoFeP, CoFeW, CoFeNb, CoFeAl, CoFeAlSi, CoMnSi, CoMnSiAl or the like. In the fourth embodiment, the later described material can be used as the nonmagnetic layer 4. As the interfacial magnetic layers 3 and 9, MnGa can also be used.

As in the first, second, and third embodiments, the MTJ element 1C of the fourth embodiment is also a so-called perpendicular-magnetization MTJ element.

Fifth Embodiment

Figure 6:
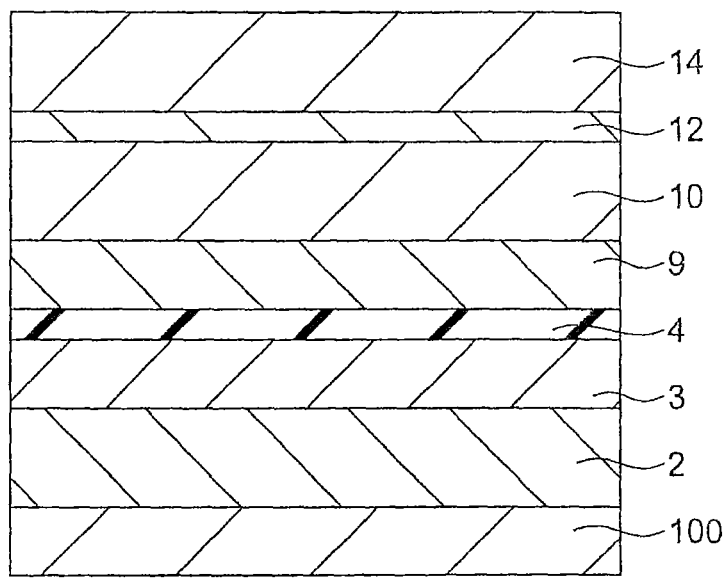
FIG. 6 is a cross-sectional view of a magnetoresistive element according to a fifth embodiment.

FIG. 6 shows a magnetoresistive element according to a fifth embodiment. FIG. 6 is a cross-sectional view of the magnetoresistive element 1D of the fifth embodiment. The magnetoresistive element 1D of this embodiment is the same as the magnetoresistive element of the fourth embodiment, except that a nonmagnetic layer 12 and a ferromagnetic layer 14 are further stacked on the ferromagnetic layer 10. In this embodiment, the interfacial magnetic layer 9 and the ferromagnetic layer 10 serve as the reference layer. The ferromagnetic layer 14 is also called a bias layer, and has a magnetization direction antiparallel (the opposite from) the magnetization direction of the ferromagnetic layer 10. The ferromagnetic layer 14 can be antiferromagnetically coupled to the ferromagnetic layer 10 via the nonmagnetic layer 12 (SAF (Synthetic Anti-Ferromagnetic) coupling). With this arrangement, it is possible to reduce and adjust a shift in the inversion current in the recording layer formed by the interfacial magnetic layer 3 and the ferromagnetic layer 2, with the shift being caused due to a leak magnetic field from the reference layer formed by the interfacial magnetic layer 9 and the ferromagnetic layer 10. The nonmagnetic layer 12 preferably has good thermal stability so that the ferromagnetic layer 10 and the bias layer 14 do not mix with each other in a heating process. The nonmagnetic layer 12 also preferably has a function to control the crystalline orientation when the bias layer 14 is formed.

Further, if the nonmagnetic layer 12 is thick, the distance between the bias layer 14 and the recording layer (the ferromagnetic layer 2 in this embodiment) is long, and the shift adjusting magnetic field to be applied from the bias layer 14 to the recording layer is small. Therefore, the film thickness of the nonmagnetic layer 12 is preferably 5 nm or smaller. The bias layer 14 is made of a ferromagnetic material that has an axis of easy magnetization in a direction perpendicular to the film plane. Since the bias layer 14 is further away from the recording layer than the reference layer is, the film thickness or the total saturation magnetization $M_s t$ of the bias layer 14 needs to be greater than that of the reference layer so that the bias layer 14 adjusts the leak magnetic field to be applied to the recording layer. That is, according to the results of the study made by the inventors, where $t_2$ and $M_{S2}$ represent the film thickness and saturation magnetization of the reference layer, and $t_3$ and $M_{S3}$ represent the film thickness and saturation magnetization of the ferromagnetic layer 14 (the bias layer), the following relational expression should be satisfied:

$$M_{S2} \times t_2 < M_{S3} \times t_3$$

The bias layer 14 of the fifth embodiment can also be applied to the magnetoresistive elements of the first through third embodiments. In that case, the nonmagnetic layer 12 is stacked on the ferromagnetic layer 8 or the ferromagnetic layer 10 to be the reference layer, and is interposed between the bias layer 14 and the reference layer.

Next, the respective layers in the MTJ elements 1, 1A, 1B, 1C, and 1D according to the first through fifth embodiments are described in detail. Specifically, the ferromagnetic layer 2, the ferromagnetic layer 10, the base layer 100, the interfacial magnetic layer 3, the interfacial magnetic layer 9, the ferromagnetic layer 8, the interfacial magnetic layer 6, and the nonmagnetic layer 4 are described in this order.

(Material of Ferromagnetic Layer 2 and Ferromagnetic Layer 10)

The ferromagnetic layer 2 and the ferromagnetic layer 10 each have an axis of easy magnetization in a direction perpendicular to the film plane. The material used as the ferromagnetic layer 2 and the ferromagnetic layer 10 is a MnGa alloy containing Mn and Ga, and the composition ratio between the Mn and Ga is $Mn_xGa_{100-x}$ (45≤x<64 atomic %). By adjusting the Mn composition rate, the saturation magnetization and the magnetic crystalline anisotropy can be controlled. Also, since a MnGa alloy has a high spin polarization, a high magnetoresistance ratio can be achieved.

Normally, there is a correlation between the Gilbert damping parameter and the spin orbit interaction of the material. A high-atomic-number material has a large spin orbit interaction, and has a large Gilbert damping parameter. Since MnGa is a material formed by light elements, the Gilbert damping parameter is low. Accordingly, only a small energy is required for a magnetization reversal, and the current density required for switching a magnetization direction with spin-polarized electrons can be greatly lowered.

(Base Layer 100)

The base layer 100 is used to control the crystalline properties such as the crystalline orientations and grain sizes of the ferromagnetic layer 2 and the layers located above the ferromagnetic layer 2. Therefore, it is essential to select an appropriate material for the base layer 100. In the following, the material and structure of the base layer 100 are described.

A first example of the base layer 100 is a nitride layer that has a (001) oriented NaCl structure, and contains at least one element selected from the group consisting of Ti, Zr, Nb, V, Hf, Ta, Mo, W, B, Al, and Ce.

A second example of the base layer 100 is a single layer of a (001) oriented perovskite oxide made of $ABO_3$. Here, the A-site contains at least one element selected from the group consisting of Sr, Ce, Dy, La, K, Ca, Na, Pb, and Ba, and the B-site contains at least one element selected from the group consisting of Ti, V, Cr, Mn, Fe, Co, Ni, Ga, Nb, Mo, Ru, Ir, Ta, Ce, and Pb.

A third example of the base layer 100 is an oxide layer that has a (001) oriented NaCl structure, and contains at least one element selected from the group consisting of Mg, Al, and Ce.

A fourth example of the base layer 100 is a layer that has a tetragonal or cubic structure, is (001) oriented, and contains at least one element selected from the group consisting of Al, Cr, Fe, Co, Rh, Pd, Ag, Ir, Pt, and Au.

Figure 7:
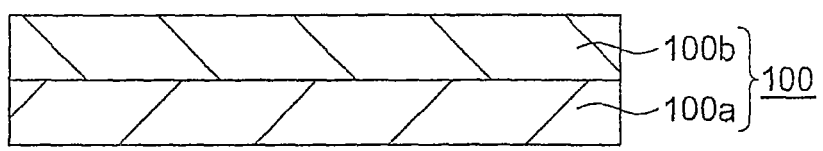
FIG. 7 is a cross-sectional view of a specific example of the base layer.
Figure 8:
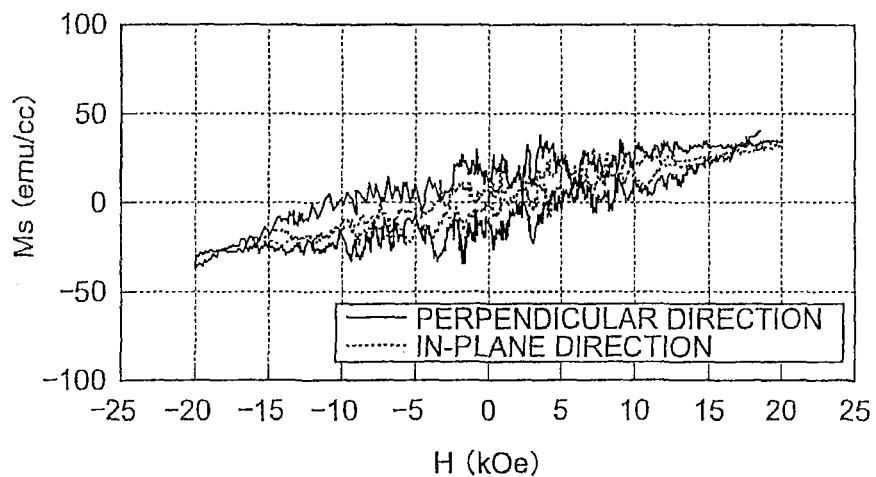
FIG. 8 is a diagram showing an example of the magnetization curves of $Mn_{75}Ga_{25}$.

A fifth example of the base layer 100 has a stacked structure in which a layer 100b of the fourth example is stacked on a layer 100a of one of the first through third examples, as shown in FIG. 7, for example. FIG. 8 shows an example of the magnetization curves of a structure expressed as "5-nm thick Ta/30-nm thick $Mn_{75}Ga_{25}$/2.5-nm thick MgO/MgO substrate". This structure was formed by inserting a 2.5-nm thick MgO layer as a base layer between the MgO substrate and the MnGa layer. According to VSM evaluation, perpendicular magnetic properties including a great coercive force of approximately 5 kOe in the perpendicular direction were achieved.

Figure 9:
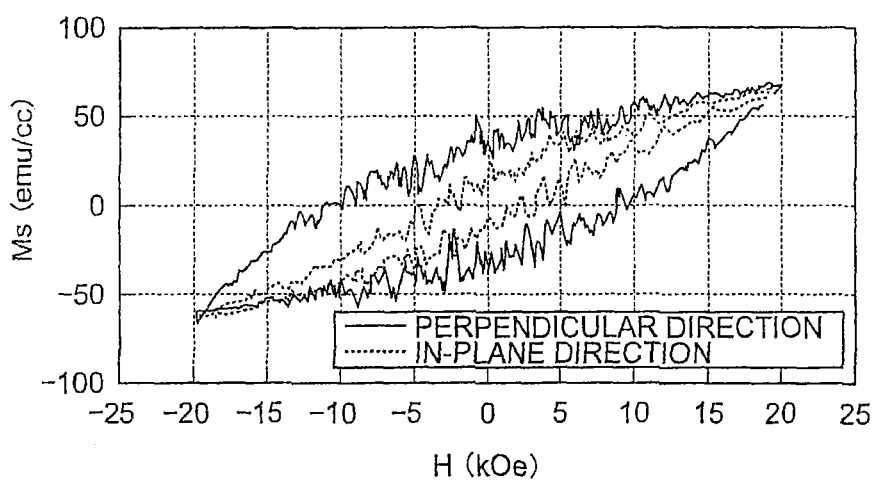
FIG. 9 is a diagram showing another example of the magnetization curves of $Mn_{75}Ga_{25}$.

However, the magnetization loops in the in-plane direction and the perpendicular direction were almost the same. The axis of easy magnetization of $Mn_{75}Ga_{25}$ is a c-axis (001) direction. Although the film crystalline properties were improved, no differences between the perpendicular direction and the in-plane direction were observed when the magnetic properties of the entire films were evaluated, supposedly because the respective crystal grains had random crystalline orientations and had easy axes of magnetization in random directions. FIG. 9 shows an example of the magnetization curves of a structure expressed as "5-nm thick Ta/30-nm thick $Mn_{75}Ga_{25}$/1-nm thick Cr/2.5-nm thick MgO/MgO substrate". This structure was formed by inserting a two-layer stacked structure expressed as 1-nm thick Cr/2.5-nm thick MgO layer as a base layer between the MgO substrate and the MnGa layer. Through VSM evaluation, it was confirmed that the coercive force in the perpendicular direction was approximately 10 kOe, and the coercive force in the in-plane direction was approximately 3.7 kOe, which is smaller than that in the direction perpendicular to the film plane. Further, the coercive force in the perpendicular direction became greater, compared with a sample having a single-layer MgO base. By stacking a Cr layer, the MgO surface energy was reduced, and the misfit with the $Mn_{75}Ga_{25}$ was reduced. Accordingly, the $Mn_{75}Ga_{25}$ grew with high crystalline properties, and the crystalline orientation distribution was restrained. This tendency is also observed with $Mn_xGa_{100-x}$ ($45 \leq x < 64$ atomic %). By modifying the structure of the base layer in the above manner, the MnGa growth can be controlled, and the magnetic properties can be improved. Other examples of two-layer stacked structures that can be used as the base layer include Ag/MgO, Ag/TiN, TiN/MgO, Cr/MgO, Cr/TiN, Cr/VN, Cr/NbN, Pt/MgO, Pt/TiN, Pt/VN, Pt/NbN, Ir/MgO, Ir/TiN, Ir/VN, and Ir/NbN. Likewise, the same effects as above can be achieved by stacking three or more layers to serve as the base layer. Examples of base layers each formed by stacking three or more layers include Cr/Fe/MgO, Cr/Fe/TIN, Ag/Fe/MgO, Cr/TiN/MgO, Ag/Cr/MgO, Cr/VN/MgO, Cr/NbN/MgO, Pt/TiN/MgO, Pt/VN/MgO, Pt/NbN/MgO, Ir/TIN/MgO, Ir/VN/MgO, Ir/NbN/MgO, Cr/Pt/VN/MgO, Cr/Pt/NbN/MgO, and Cr/Pt/TIN/MgO.

(Interfacial Magnetic Layer 3 and Interfacial Magnetic Layer 9)

The interfacial magnetic layer 3 and the interfacial magnetic layer 9 each have an axis of easy magnetization in a direction perpendicular to the film plane. An example of a material that can be used as the interfacial magnetic layer 3 and the interfacial magnetic layer 9 is an alloy containing Mn and Al. A MnAl alloy is a material formed by light elements, and therefore, has a small Gilbert damping parameter. Accordingly, the energy required for a magnetization reversal is small, and the current density required for switching magnetization directions with spin-polarized electrons can be greatly lowered. Also, a MnAl alloy has half-metallic characteristics, since an energy gap exists in one of the spin bands of up-spin electrons and down-spin electrons in the (001) direction, and has a high spin polarization. Accordingly, a high magnetoresistance ratio can be achieved. And also, the interfacial magnetic layer 3 and 9, can be an alloy containing at least one element selected from the group consisting of Fe and Co, and at least one element selected from the group consisting of Cr, Ni, B, C, P, Ta, Ti, Mo, Al, Si, W, Nb, Mn, and Ge. For example, the alloy can be CoFeB, but can also be CoFeSi, CoFeP, CoFeW, CoFeNb, CoFeAl, CoFeAlSi, CoMnSi, CoMnSiAl, or the like.

(Ferromagnetic Layer 8)

The ferromagnetic layer 8 has an axis of easy magnetization in a direction perpendicular to the film plane. The material used as the ferromagnetic layer 8 can be a metal that has the (111) crystalline orientation of a face-centered cubic (FCC) structure or has the (001) crystalline orientation of a hexagonal close-packed (HCP) structure, or a metal that can form an multilayer, for example. An example of the metal that has the (111) crystalline orientation of a FCC structure or the (001) crystalline orientation of a HCP structure is an alloy containing at least one element selected from the first group consisting of Fe, Co, Ni, and Cu, and at least one element selected from the second group consisting of Pt, Pd, Rh, and Au. Specifically, the metal is a ferromagnetic alloy such as CoPd, CoPt, NiCo, or NiPt.

The multilayer used in the ferromagnetic layer 8 can be a structure in which one element or more of Fe, Co, and Ni or an alloy containing the one element (a ferromagnetic film), and one element of Cr, Pt, Pd, Ir, Rh, Ru, Os, Re, Au, and Cu or an alloy containing the one element (a nonmagnetic film) are alternately stacked. For example, the multilayer can be a Co/Pt multilayer, a Co/Pd multilayer, a CoCr/Pt multilayer, a Co/Ru multilayer, a Co/Os multilayer, a Co/Au multilayer, a Ni/Cu multilayer, or the like. In each of the multilayers, the magnetic anisotropic energy density and saturation magnetization can be controlled by adjusting the addition of an element to the ferromagnetic film and the film thickness ratio between the ferromagnetic film and the nonmagnetic film.

Also, the material used as the ferromagnetic layer 8 can be an alloy containing at least one element selected from the group consisting of transition metals Fe, Co, and Ni, and at least one element selected from the group consisting of rare-earth metals Tb, Dy, and Gd. For example, the material can be TbFe, TbCo, TbFeCo, DyTbFeCo, or GdTbCo. Alternatively, the material can be a multilayer structure formed by alternately stacking those alloys. Specifically, such a multilayer structure can be a multilayer film such as a TbFe/Co film, a TbCo/Fe film, a TbFeCo/CoFe film, a DyFe/Co film, a DyCo/Fe film, or a DyFeCo/CoFe film. In each of those alloys, the magnetic anisotropy energy density and saturation magnetization can be controlled by adjusting the film thickness ratio and the composition.

The material used as the ferromagnetic layer 8 can also be an alloy containing at least one element selected from the first group consisting of Fe, Co, Ni, and Cu, and at least one element selected from the second group consisting of Pt, Pd, Rh, and Au. Specifically, the material can be a ferromagnetic alloy such as FeRh, FePt, FePd, or CoPt.

(Interfacial Magnetic Layer 6)

To increase the magnetoresistance ratio of the magnetoresistive element, a material having a high spin polarization is used as the interfacial magnetic layer adjacent to the tunnel barrier layer made of MgO. For example, the interfacial magnetic layer 6 is preferably made of an alloy containing at least one metal selected from the group consisting of Fe and Co. If an interfacial magnetic layer made of CoFe, a nonmagnetic layer made of MgO, and an interfacial magnetic layer made of CoFe are formed, for example, the epitaxial relationship, CoFe (001)/MgO (001)/CoFe (001), can be formed. In this case, the wavenumber selectivity of tunneling electrons can be improved, and accordingly, a high magnetoresistance ratio can be achieved.

It should be noted that, if the interfacial magnetic layer 6 is epitaxially grown in the (001) orientation with respect to MgO, a high magnetoresistance ratio can be achieved. Therefore, the interfacial magnetic layer 6 in contact with the nonmagnetic layer 4 made of MgO can expand and contract in the direction perpendicular to the film plane.

Also, to control the saturation magnetization, at least one element selected from the group consisting of Cr, Ni, B, C, P, Ta, Ti, Mo, Al, Si, W, Nb, Mn, and Ge can be added to the interfacial magnetic layer 6. That is, the interfacial magnetic layer 6 can be an alloy containing at least one element selected from the group consisting of Fe and Co, and at least one element selected from the group consisting of Cr, Ni, B, C, P, Ta, Ti, Mo, Al, Si, W, Nb, Mn, and Ge. For example, the alloy can be CoFeB, but can also be CoFeSi, CoFeP, CoFeW, CoFeNb, CoFeAl, CoFeAlSi, CoMnSi, CoMnSiAl, or the like. Those alloys have the similar spin polarization as that of CoFeB. Alternatively, the interfacial magnetic layer 6 can be a Heusler metal such as $Co_2FeSi$, $Co_2MnSi$, or $Co_2MnGe$. A Heusler metal has a spin polarization equal to or higher than that of CoFeB, and therefore, is suited to be an interfacial magnetic layer.

(Nonmagnetic Layer 4)

The nonmagnetic layer 4 is made of an insulating material, and therefore, a tunnel barrier layer is used as the nonmagnetic layer 4. The tunnel barrier layer material can be an oxide having a main component that is at least one element selected from the group consisting of magnesium (Mg), calcium (Ca), barium (Ba), aluminum (Al), silver (Ag), copper (Cu), beryllium (Be), strontium (Sr), zinc (Zn), and titanium (Ti). Specifically, the tunnel barrier layer material can be MgO, AlO, ZnO, SrO, TiO, or the like. Alternatively, the tunnel barrier layer can be a mixed crystalline material containing two or more materials selected from the above mentioned oxide group, or can be a stacked structure of those materials. Examples of mixed crystalline materials include MgAlO, MgZnO, MgTiO, and MgCaO. Examples of two-layer stacked structures include MgO/ZnO, MgO/AlO, TiO/AlO, and MgAlO/MgO. Examples of three-layer stacked structures include AlO/MgO/AlO, MgO/ZnO/MgO, and ZnO/MgO/ZnO.

The tunnel barrier layer can be either a crystalline material or an amorphous material. If the tunnel barrier layer is a crystalline layer, however, electron scattering can be restrained in the tunnel barrier, and the probability of selective tunneling conduction of electrons from a ferromagnetic layer while wavenumber is kept becomes higher. Accordingly, the magnetoresistance ratio can be made higher. Therefore, to achieve a high magnetoresistance ratio, it is preferable to use a crystalline tunnel barrier.

For example, in a case where a stacked structure is formed by stacking a ferromagnetic layer made of MnGa, a nonmagnetic layer made of crystalline MgO, and a ferromagnetic layer made of MnGa in this order, the epitaxial relationship, MnGa (001)/MgO (001)/MnGa (001), can be formed. Accordingly, the wavenumber selectivity of tunneling electrons can be improved, and a high magnetoresistance ratio can be achieved. However, the lattice mismatch determined from the lattice constants of bulks in the film in-plane directions of MnGa and MgO is as large as approximately 7.7%. The lattice mismatch is defined by the following mathematical formula: $(a(MgO)-a(MnGa))/a(MnGa)\times 100$. Here, $a(MgO)$ and $a(MnGa)$ represent the lattice constants of MnGa and MgO in the film in-plane directions, respectively. If the lattice mismatch is large, a dislocation or the like is caused in an interface so as to reduce the interfacial energy generated due to lattice distortion. In that case, an epitaxial relationship is formed between crystal grains, and it is difficult to cause uniform epitaxial growth in the film plane. When a current is applied to the element, a dislocation becomes the scattering source of electrons, and the magnetoresistance ratio becomes lower. Therefore, to cause uniform epitaxial growth in the film plane without a dislocation, it is essential to form a stacked structure with materials having a small lattice mismatch. Therefore, MgAlO is used as the nonmagnetic layer 4, and MnGa (001)/MgAlO (001)/MnGa (001) is formed. Accordingly, the lattice mismatch can be reduced to 3.5%, and a higher magnetoresistance ratio is achieved.

EXAMPLES

Next, the stacked structures of specific perpendicular-magnetization MTJ elements are described as examples. The magnetoresistive films (samples) described below were formed to manufacture perpendicular-magnetization MTJ elements of one of the first through fifth embodiments. After the film formation, vacuum annealing is performed at an appropriate temperature for an appropriate period of time, so as to optimize TMR characteristics and magnetic characteristics.

Example 1

As a perpendicular-magnetization MTJ element of Example 1, the MTJ element 1 having perpendicular magnetization according to the first embodiment illustrated in FIG. 1 is formed. The MTJ element 1 according to Example 1 has a structure formed by stacking a base layer 100, a ferromagnetic layer 2, a nonmagnetic layer 4, an interfacial magnetic layer 6, and a ferromagnetic layer 8 in this order on a MgO single-crystal substrate (not shown). Here, a 20-nm thick MnGa film is used as the ferromagnetic layer 2. The ferromagnetic layer 2 has an axis of easy magnetization in a direction perpendicular to the film plane, and serves as the recording layer having a changeable magnetization direction.

A 16-nm thick TbCoFe film is used as the ferromagnetic layer 8. The ferromagnetic layer 8 has an axis of easy magnetization in a direction perpendicular to the film plane, and serves as the reference layer having a fixed magnetization direction. A 1-nm thick $Co_{60}Fe_{20}B_{20}$ film is used as the interfacial magnetic layer 6. A tunnel barrier layer made of MgAlO is used as the nonmagnetic layer 4.

The electrical resistance values were measured at room temperature, while a magnetic field was swept in a direction perpendicular to the film plane of the perpendicular MTJ. The results show that the ratio of change in electrical resistance between a case where the magnetization directions of the recording layer and the reference layer are parallel and a case where the magnetization directions are antiparallel is 27%.

Example 2

As a perpendicular-magnetization MTJ element of Example 2, the perpendicular-magnetization MTJ element 1A according to the second embodiment illustrated in FIG. 3 was formed. The MTJ element 1A according to Example 2 has a structure formed by stacking a base layer 100, a ferromagnetic layer 2, an interfacial magnetic layer 3, a nonmagnetic layer 4, an interfacial magnetic layer 6, and a ferromagnetic layer 8 in this order on a MgO single-crystal substrate (not shown).

Here, a 20-nm thick MnGa film is used as the ferromagnetic layer 2. A 20-nm thick MnAl film is used as the interfacial magnetic layer 3. A 1-nm thick $Co_{60}Fe_{20}B_{20}$ film is used as the interfacial magnetic layer 6. A 16-nm thick TbCoFe film is used as the ferromagnetic layer 8. A tunnel barrier layer made of MgAlO is used as the nonmagnetic layer 4.

The electrical resistance values were measured at room temperature, while a magnetic field was swept in a direction perpendicular to the film plane of the perpendicular MTJ. The results show that the ratio of change in electrical resistance between a case where the magnetization directions of the recording layer and the reference layer are parallel and a case where the magnetization directions are antiparallel is 43%.

Example 3

As a perpendicular-magnetization MTJ element of Example 3, the perpendicular-magnetization MTJ element 1B according to the third embodiment illustrated in FIG. 4 is formed. The MTJ element 1B according to Example 3 has a structure formed by stacking a base layer 100, a ferromagnetic layer 2, an interfacial magnetic layer 3, a nonmagnetic layer (a tunnel barrier layer) 4, and a ferromagnetic layer 10 in this order on a MgO single-crystal substrate (not shown). Here, a 20-nm thick $Mn_{50}Ga_{50}$ film is used as the ferromagnetic layer 2. A 20-nm thick MnAl film is used as the interfacial magnetic layer 3. A 50-nm thick $Mn_{64}Ga_{36}$ film is used as the ferromagnetic layer 10. A tunnel barrier layer made of MgO is used as the nonmagnetic layer 4.

The electrical resistance values were measured at room temperature, while a magnetic field was swept in a direction perpendicular to the film plane of the perpendicular MTJ. The results show that the ratio of change in electrical resistance between a case where the magnetization directions of the recording layer and the reference layer are parallel and a case where the magnetization directions are antiparallel is 23%.

Example 4

As a perpendicular-magnetization MTJ element of Example 4, the perpendicular-magnetization MTJ element 1C according to the fourth embodiment illustrated in FIG. 5 is formed. The MTJ element 1C according to Example 4 has a structure formed by stacking a base layer 100, a ferromagnetic layer 2, an interfacial magnetic layer 3, a nonmagnetic layer 4, an interfacial magnetic layer 9, and a ferromagnetic layer 10 in this order on a MgO single-crystal substrate (not shown).

Here, a 20-nm thick $Mn_{50}Ga_{50}$ film is used as the ferromagnetic layer 2. A 20-nm thick MnAl film is used as the interfacial magnetic layer 3. A 20-nm thick MnAl film is used as the interfacial magnetic layer 9. A 50-nm thick $Mn_{64}Ga_{36}$ film is used as the ferromagnetic layer 10. A tunnel barrier layer made of MgO is used as the nonmagnetic layer 4.

The electrical resistance values were measured at room temperature, while a magnetic field was swept in a direction perpendicular to the film plane of the perpendicular MTJ. The results show that the ratio of change in electrical resistance between a case where the magnetization directions of the recording layer and the reference layer are parallel and a case where the magnetization directions are antiparallel is 19%.

As described so far, each of the embodiments and Examples can provide a magnetoresistive element that has perpendicular magnetic anisotropy and is capable of achieving a greater magnetoresistive effect.

Sixth Embodiment

The MTJ elements 1, 1A, 1B, 1C, and 1D of the first through fifth embodiments can be applied to MRAMs. In the following, for ease of explanation, an example case where the MTJ element 1 of the first embodiment is used is described.

Each memory element forming a MRAM includes a recording layer that has a changeable (or reversible) magnetization (or spin) direction, a reference layer that has an invariable (or fixed) magnetization direction, and a nonmagnetic layer interposed between the recording layer and the reference layer. Where "the magnetization direction of the reference layer is invariable", the magnetization direction of the reference layer does not change when the magnetization switching current to be used for switching the magnetization direction of the recording layer is applied to the reference layer. As one of the two ferromagnetic layers each having an axis of easy magnetization in a direction perpendicular to the film plane serves as the recording layer while the other one serves as the reference layer, a MRAM including MTJ elements as memory elements can be formed.

Specifically, the two ferromagnetic layers are made to have a difference in coercive force from each other, so that the two ferromagnetic layers can be used as the recording layer and the reference layer. Therefore, in a MTJ element, a ferromagnetic layer having a large inversion current is used as one ferromagnetic layer (the reference layer), and a ferromagnetic layer having a smaller inversion current than the ferromagnetic layer serving as the reference layer is used as the other ferromagnetic layer (the recording layer). In this manner, a MTJ element including a ferromagnetic layer with a variable magnetization direction and a ferromagnetic layer with a fixed magnetization direction can be realized.

Figure 10:
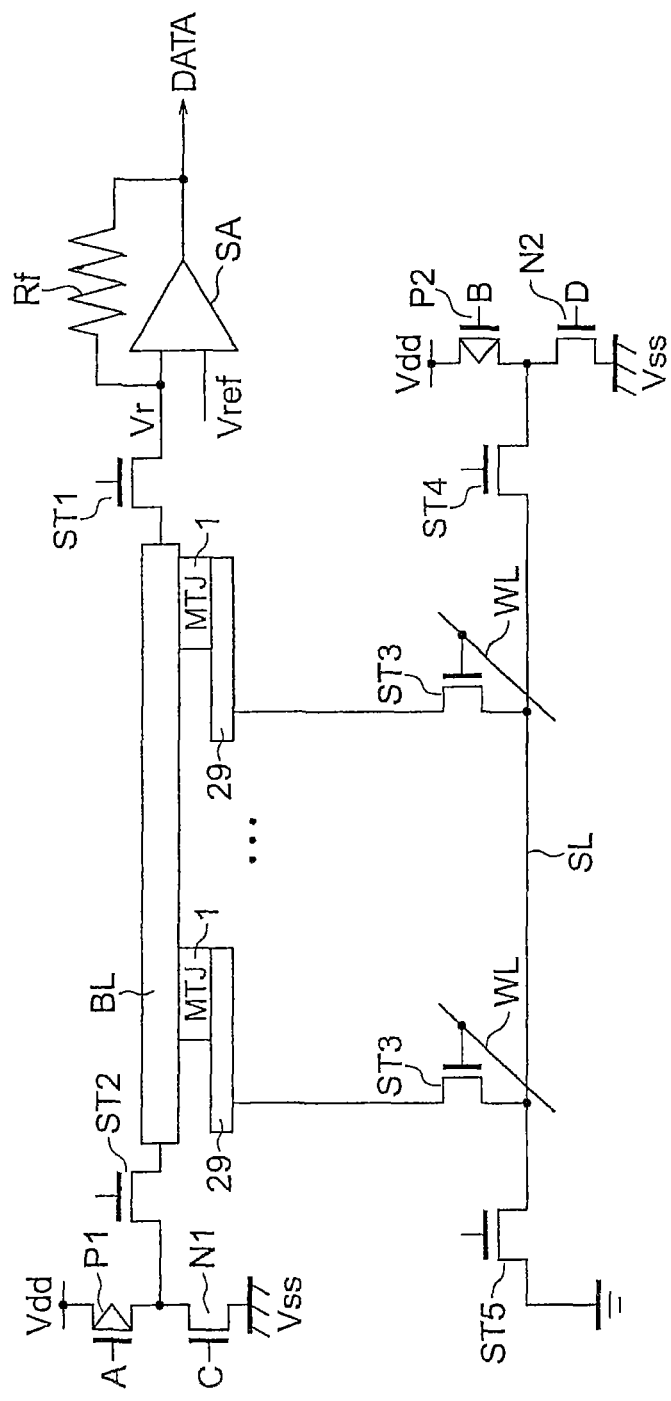
FIG. 10 is a circuit diagram of a MRAM according to a sixth embodiment.

FIG. 10 is a circuit diagram showing the structure of the MRAM according to a sixth embodiment. The MRAM of this embodiment includes memory cells arranged in a matrix fashion, and each of the memory cells includes the MTJ element 1. One end of each of the MTJ elements 1 is electrically connected to a bit line BL. One end of each bit line BL is electrically connected to a sense amplifier SA via an N-channel MOS transistor ST1 serving as a select switch. The sense amplifier SA compares a read potential Vr and a reference potential Vref supplied from a MTJ element 1, and outputs the result of the comparison as an output signal DATA. A resistor Rf electrically connected to the sense amplifier SA is a feedback resistor.

The other end of each bit line BL is electrically connected to the drain of a P-channel MOS transistor P1 and the drain of an N-channel MOS transistor N1 via an N-channel MOS transistor ST2 serving as a select switch. The source of the MOS transistor P1 is connected to a supply terminal Vdd, and the source of the MOS transistor N1 is connected to a ground terminal Vss.

The other end of each of the MTJ elements 1 is electrically connected to a lower electrode 29. Each of the lower electrodes 29 is electrically connected to a source line SL via an N-channel MOS transistor ST3 serving as a select switch. It should be noted that the source line SL extends in a direction parallel to the bit lines BL.

The source line SL is electrically connected to the drain of a P-channel MOS transistor P2 and the drain of an N-channel MOS transistor N2 via an N-channel MOS transistor ST4 serving as a select switch. The source of the MOS transistor P2 is connected to the supply terminal Vdd, and the source of the MOS transistor N2 is connected to the ground terminal Vss. The source line SL is also connected to the ground terminal Vss via an N-channel MOS transistor ST5 serving as a select switch.

The gate of each MOS transistor ST3 is electrically connected to a word line WL. Each word line WL extends in a direction perpendicular to the direction in which the bit lines BL extend.

Data writing into the MTJ elements 1 is performed by a spin-injection writing technique. That is, the direction of the write current flowing in the MTJ elements 1 is controlled by switching on and off the MOS transistors P1, P2, N1, and N2 with control signals A, B, C, and D, so as to realize data writing.

Data reading from the MTJ elements 1 is performed by supplying a read current to the MTJ elements 1. The read current is set at a smaller value than the write current. Each MTJ element 1 has a resistance value that varies depending on whether the magnetization directions of the reference layer and the recording layer are parallel or antiparallel, because of a magnetoresistive effect. That is, the resistance value of a MTJ element 1 becomes the smallest when the magnetization directions of the reference layer and the recording layer are parallel, and the resistance value of the MTJ element 1 becomes the largest when the magnetization directions of the reference layer and the recording layer are antiparallel. Such changes in resistance value are detected by the sense amplifier SA, to read the information recorded in the MTJ elements 1.

Figure 11:
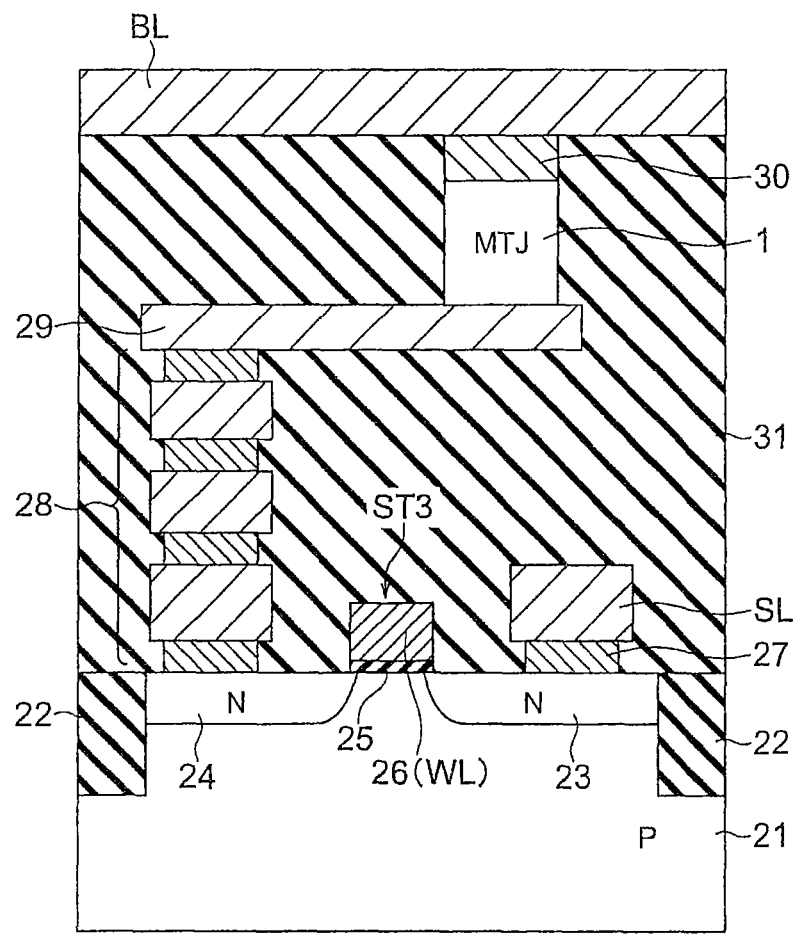
FIG. 11 is a cross-sectional view of a memory cell of the MRAM according to the sixth embodiment.

FIG. 11 is a cross-sectional view of one of the above described memory cells. A device isolation insulating layer 22 having a STI (Shallow Trench Isolation) structure is formed in a P-type semiconductor substrate 21. The N-channel MOS transistor ST3 as a select switch is formed in the device region (the active region) surrounded by the device isolation insulating layer 22. The MOS transistor ST3 includes diffusion regions 23 and 24 serving as source/drain regions, a gate insulating film 25 formed on the channel region between the diffusion regions 23 and 24, and a gate electrode 26 formed on the gate insulating film 25. The gate electrode 26 is equivalent to the word lines WL shown in FIG. 10.

A contact plug 27 is formed on the diffusion region 23. The source line SL is formed on the contact plug 27. A contact plug 28 is formed on the diffusion region 24. The lower electrode 29 is formed on the contact plug 28. The MTJ element 1 is provided on the lower electrode 29. An upper electrode 30 is formed on the MTJ element 1. The bit line BL is provided on the upper electrode 30. The space between the semiconductor substrate 21 and the bit line BL is filled with an interlayer insulating layer 31.

An example case where magnetoresistive elements according to one of the first through fifth embodiments are used in a MRAM has been described so far. However, the magnetoresistive elements according to the first through fifth embodiments can also be used in any other devices utilizing the TMR effect.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetoresistive element comprising:
   a base layer;
   a first magnetic layer provided on the base layer, and including a first magnetic film having an axis of easy magnetization in a direction perpendicular to a film plane, the first magnetic film including $Mn_xGa_{100-x}$ (45≤x<64 atomic %);
   a first nonmagnetic layer provided on the first magnetic layer;
   a second magnetic layer provided on the first nonmagnetic layer, and including a second magnetic film having an axis of easy magnetization in a direction perpendicular to a film plane, the second magnetic film including $Mn_yGa_{100-y}$ (45≤y<64 atomic %); and
   an interfacial layer provided between the first magnetic layer and the first nonmagnetic layer, and/or between the second magnetic layer and the first nonmagnetic layer, the interfacial layer including a Heusler alloy,
   the first and second magnetic layers comprising different Mn composition rates from each other, the first magnetic layer having a smaller Mn concentration than the second magnetic layer, a magnetization direction of the first magnetic layer being changeable and a magnetization direction of the second magnetic layer being unchangeable.

2. The magnetoresistive element according to claim 1, wherein the interfacial layer includes one of $Co_2FeSi$, $Co_2MnSi$, and $Co_2MnGe$.

3. The magnetoresistive element according to claim 1, wherein the first nonmagnetic layer is an oxide that contains one element selected from the group consisting of Mg, Ca, Al, Sr, and Ti.

4. The magnetoresistive element according to claim 1, wherein the base layer includes a nitride layer that has a (001) oriented NaCl structure, the nitride layer containing at least one element selected from the group consisting of Ti, Zr, Nb, V, Hf, Ta, Mo, W, B, Al, and Ce.

5. The magnetoresistive element according to claim 1, wherein the base layer includes a (001) oriented perovskite oxide that is made of $ABO_3$, the A-site containing at least one element selected from the group consisting of Sr, Ce, Dy, La, K, Ca, Na, Pb, and Ba, the B-site containing at least one element selected from the group consisting of Ti, V, Cr, Mn, Fe, Co, Ni, Ga, Nb, Mo, Ru, Ir, Ta, Ce, and Pb.

6. The magnetoresistive element according to claim 1, wherein the base layer includes an oxide layer that has a (001) oriented NaCl structure, the oxide layer containing at least one element selected from the group consisting of Mg, Al, and Ce.

7. The magnetoresistive element according to claim 1, wherein the base layer comprises one of a tetragonal structure and a cubic structure, is (001) oriented, and contains at least one element selected from the group consisting of Al, Cr, Fe, Co, Rh, Pd, Ag, Ir, Pt, and Au.

8. The magnetoresistive element according to claim 1, wherein
the base layer includes a first layer and a second layer provided on the first layer,
the first layer includes at least one of:
a nitride layer that has a (001) oriented NaCl structure, and contains at least one element selected from the group consisting of Ti, Zr, Nb, V, Hf, Ta, Mo, W, B, Al, and Ce;
a (001) oriented perovskite oxide layer that is made of $ABO_3$, the A-site containing at least one element selected from the group consisting of Sr, Ce, Dy, La, K, Ca, Na, Pb, and Ba, the B-site containing at least one element selected from the group consisting of Ti, V, Cr, Mn, Fe, Co, Ni, Ga, Nb, Mo, Ru, Ir, Ta, Ce, and Pb; and
an oxide layer that has a (001) oriented NaCl structure, and contains at least one element selected from the group consisting of Mg, Al, and Ce, and
the second layer has one of a tetragonal structure and a cubic structure, is (001) oriented, and contains at least one element selected from the group consisting of Al, Cr, Fe, Co, Rh, Pd, Ag, Ir, Pt, and Au.

9. The magnetoresistive element according to claim 1, wherein
the second magnetic layer has a fixed magnetization direction,
the magnetoresistive element further comprises: a third magnetic layer provided on the opposite side of the second magnetic layer from the first nonmagnetic layer, having an axis of easy magnetization in a direction perpendicular to a film plane, and having a magnetization direction antiparallel to the magnetization direction of the second magnetic layer; and a second nonmagnetic layer provided between the second ferromagnetic layer and the third ferromagnetic layer,
wherein $M_{S2}$ represents a saturation magnetization of the second magnetic layer, $t_2$ represents a film thickness of the second magnetic layer, $M_{S3}$ represents a saturation magnetization of the third magnetic layer, and $t_3$ represents a film thickness of the third magnetic layer, and the following relationship is satisfied $$M_{S2} \times t_2 < M_{S3} \times t_3.$$

10. A magnetic memory comprising:
the magnetoresistive element according to claim 1,
a first interconnect that is electrically connected to the first magnetic layer of the magnetoresistive element; and
a second interconnect that is electrically connected to the second magnetic layer of the magnetoresistive element.

11. A magnetoresistive element comprising:
a base layer; and
a stacked structure provided on the base layer, the stacked structure including: a first magnetic layer including a first magnetic film having an axis of easy magnetization in a direction perpendicular to a film plane, the first magnetic film including $Mn_xGa_{100-x}$ ($45 \leq x < 64$ atomic %); a second magnetic layer including a second magnetic film having an axis of easy magnetization in a direction perpendicular to a film plane; a first nonmagnetic layer provided between the first magnetic layer and the second magnetic layer, and containing at least one element selected from the group consisting of Mg, Ca, Ba, Al, Ag, Cu, Be, Sr, Zn, and Ti; and a first interfacial layer provided between the first magnetic layer and the first nonmagnetic layer, the first interfacial layer including a Heusler alloy,
a magnetization direction of the first magnetic layer being changeable,
wherein the second magnetic layer has a fixed magnetization direction,
wherein the magnetoresistive element further comprises: a third magnetic layer provided on the opposite side of the second magnetic layer from the first nonmagnetic layer, having an axis of easy magnetization in a direction perpendicular to a film plane, and having a magnetization direction antiparallel to the magnetization direction of the second magnetic layer; and a second nonmagnetic layer provided between the second ferromagnetic layer and the third ferromagnetic layer,
wherein $M_{S2}$ represents a saturation magnetization of the second magnetic layer, $t_2$ represents a film thickness of the second magnetic layer, $M_{S3}$ represents a saturation magnetization of the third magnetic layer, and $t_3$ represents a film thickness of the third magnetic layer, and the following relationship is satisfied $$M_{S2} \times t_2 < M_{S3} \times t_3.$$

12. The magnetoresistive element according to claim 11, wherein the first interfacial layer includes one of $Co_2FeSi$, $Co_2MnSi$, and $Co_2MnGe$.

13. The magnetoresistive element according to claim 11, further comprising
a second interfacial layer provided between the second magnetic layer and the first nonmagnetic layer, the second interfacial layer including a Heusler alloy.

14. The magnetoresistive element according to claim 11, wherein the base layer includes a nitride layer that has a (001) oriented NaCl structure, the nitride layer containing at least one element selected from the group consisting of Ti, Zr, Nb, V, Hf, Ta, Mo, W, B, Al, and Ce.

15. The magnetoresistive element according to claim 11, wherein the base layer includes a (001) oriented perovskite oxide that is made of $ABO_3$, the A-site containing at least one element selected from the group consisting of Sr, Ce, Dy, La, K, Ca, Na, Pb, and Ba, the B-site containing at least one element selected from the group consisting of Ti, V, Cr, Mn, Fe, Co, Ni, Ga, Nb, Mo, Ru, Ir, Ta, Ce, and Pb.

16. The magnetoresistive element according to claim 11, wherein the base layer includes an oxide layer that has a (001) oriented NaCl structure, the oxide layer containing at least one element selected from the group consisting of Mg, Al, and Ce.

17. The magnetoresistive element according to claim 11, wherein the base layer comprises one of a tetragonal structure and a cubic structure, is (001) oriented, and contains at least one element selected from the group consisting of Al, Cr, Fe, Co, Rh, Pd, Ag, Ir, Pt, and Au.

18. The magnetoresistive element according to claim 11, wherein
the base layer includes a first layer and a second layer provided on the first layer,
the first layer includes at least one of:
a nitride layer that has a (001) oriented NaCl structure, and contains at least one element selected from the group consisting of Ti, Zr, Nb, V, Hf, Ta, Mo, W, B, Al, and Ce;

a (001) oriented perovskite oxide layer that is made of ABO$_3$, the A-site containing at least one element selected from the group consisting of Sr, Ce, Dy, La, K, Ca, Na, Pb, and Ba, the B-site containing at least one element selected from the group consisting of Ti, V, Cr, Mn, Fe, Co, Ni, Ga, Nb, Mo, Ru, Ir, Ta, Ce, and Pb; and an oxide layer that has a (001) oriented NaCl structure, and contains at least one element selected from the group consisting of Mg, Al, and Ce, and the second layer has one of a tetragonal structure and a cubic structure, is (001) oriented, and contains at least one element selected from the group consisting of Al, Cr, Fe, Co, Rh, Pd, Ag, Ir, Pt, and Au.

19. A magnetic memory comprising:

the magnetoresistive element according to claim 11;

a first interconnect that is electrically connected to the first magnetic layer of the magnetoresistive element; and a second interconnect that is electrically connected to the second magnetic layer of the magnetoresistive element.

* * * * *